(12) United States Patent
Park

(10) Patent No.: US 7,851,285 B2
(45) Date of Patent: Dec. 14, 2010

(54) NON-VOLATILE MEMORY DEVICE AND METHOD FOR FABRICATING THE SAME

(75) Inventor: Chang Soo Park, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 745 days.

(21) Appl. No.: 11/771,477

(22) Filed: Jun. 29, 2007

(65) Prior Publication Data

US 2008/0251836 A1    Oct. 16, 2008

(30) Foreign Application Priority Data

Apr. 16, 2007    (KR) .................... 10-2007-0037030

(51) Int. Cl.
*H01L 21/336* (2006.01)

(52) U.S. Cl. .............. 438/197; 438/216; 438/287; 257/324; 257/325; 257/326; 257/314; 257/298; 257/295; 257/296; 257/297; 257/349; 257/547; 257/620; 257/E21.423

(58) Field of Classification Search ................. 438/197
See application file for complete search history.

(56) References Cited

U.S. PATENT DOCUMENTS

| | | | |
|---|---|---|---|
| 5,768,192 A | | 6/1998 | Eitan |
| 5,834,353 A * | | 11/1998 | Wu .......................... 438/287 |
| 6,251,761 B1 * | | 6/2001 | Rodder et al. .............. 438/591 |
| 6,559,014 B1 * | | 5/2003 | Jeon .......................... 438/287 |
| 6,607,973 B1 * | | 8/2003 | Jeon .......................... 438/591 |
| 6,642,095 B2 * | | 11/2003 | Lee ............................ 438/216 |
| 6,642,573 B1 * | | 11/2003 | Halliyal et al. ............. 257/316 |
| 6,645,882 B1 * | | 11/2003 | Halliyal et al. ............. 438/785 |
| 6,670,670 B2 * | | 12/2003 | Chae et al. ................. 257/316 |
| 6,713,358 B1 * | | 3/2004 | Chau et al. ................. 438/287 |
| 6,759,346 B1 * | | 7/2004 | Jeon .......................... 438/763 |
| 6,790,755 B2 * | | 9/2004 | Jeon .......................... 438/591 |
| 6,803,275 B1 | | 10/2004 | Park et al. |

(Continued)

FOREIGN PATENT DOCUMENTS

CN    1466221    1/2004

(Continued)

OTHER PUBLICATIONS

Role of Nitrogen incorporation into Hf-based High-k Gate dielectrics for termination of local current leakage paths, Watanabe et al., the japan society of applied physics (2005).*

(Continued)

*Primary Examiner*—Fernando L Toledo
*Assistant Examiner*—Ankush k Singal
(74) *Attorney, Agent, or Firm*—Townsend and Townsend and Crew LLP

(57) ABSTRACT

A method for fabricating a non-volatile memory device includes forming a charge tunneling layer composed of a hafnium silicate ($HfSi_xO_yN_z$) layer on a semiconductor substrate. A charge trapping layer composed of a hafnium oxide nitride ($HfO_xN_y$) layer is formed on the charge tunneling layer. A charge blocking layer composed of a hafnium oxide layer is formed on the charge trapping layer. A gate layer is formed on the charge blocking layer. A non-volatile memory device fabricated by the method is also disclosed.

19 Claims, 6 Drawing Sheets

U.S. PATENT DOCUMENTS

| | | | |
|---|---|---|---|
| 6,867,101 B1* | 3/2005 | Yu | 438/287 |
| 6,930,060 B2* | 8/2005 | Chou et al. | 438/786 |
| 6,936,884 B2 | 8/2005 | Chae et al. | |
| 6,958,511 B1* | 10/2005 | Halliyal et al. | 257/314 |
| 6,984,591 B1* | 1/2006 | Buchanan et al. | 438/778 |
| 7,009,245 B2* | 3/2006 | Chang | 257/321 |
| 7,045,850 B2 | 5/2006 | Kim et al. | |
| 7,053,448 B2* | 5/2006 | Jeon et al. | 257/324 |
| 7,084,023 B2* | 8/2006 | Nakajima et al. | 438/197 |
| 7,138,692 B2* | 11/2006 | Tamura et al. | 257/412 |
| 7,192,892 B2* | 3/2007 | Ahn et al. | 438/785 |
| 7,326,980 B2* | 2/2008 | Ahn et al. | 257/295 |
| 7,361,538 B2* | 4/2008 | Luan et al. | 438/197 |
| 7,420,256 B2* | 9/2008 | Chae et al. | 257/411 |
| 7,450,423 B2* | 11/2008 | Lai et al. | 365/185.18 |
| 7,465,626 B2* | 12/2008 | Chen et al. | 438/240 |
| 7,476,916 B2* | 1/2009 | Tatsumi et al. | 257/213 |
| 7,476,927 B2* | 1/2009 | Bhattacharyya | 257/314 |
| 2002/0089023 A1* | 7/2002 | Yu et al. | 257/411 |
| 2002/0130340 A1* | 9/2002 | Ma et al. | 257/295 |
| 2002/0142624 A1* | 10/2002 | Levy et al. | 438/786 |
| 2003/0025148 A1* | 2/2003 | Hsieh et al. | 257/315 |
| 2003/0089935 A1* | 5/2003 | Fan et al. | 257/296 |
| 2003/0155605 A1* | 8/2003 | Jong et al. | 257/314 |
| 2003/0194853 A1* | 10/2003 | Jeon | 438/591 |
| 2004/0043569 A1* | 3/2004 | Ahn et al. | 438/287 |
| 2004/0084736 A1* | 5/2004 | Harada | 257/295 |
| 2004/0168627 A1* | 9/2004 | Conley et al. | 117/89 |
| 2004/0169240 A1* | 9/2004 | Koyama et al. | 257/411 |
| 2004/0171280 A1* | 9/2004 | Conley et al. | 438/785 |
| 2004/0198069 A1* | 10/2004 | Metzner et al. | 438/785 |
| 2004/0262672 A1 | 12/2004 | Chang | |
| 2005/0152094 A1* | 7/2005 | Jeong et al. | 361/312 |
| 2005/0160981 A9 | 7/2005 | Vaartstra | |
| 2005/0230766 A1* | 10/2005 | Nomoto et al. | 257/411 |
| 2005/0236678 A1* | 10/2005 | Sato et al. | 257/410 |
| 2005/0247985 A1* | 11/2005 | Watanabe et al. | 257/411 |
| 2005/0269651 A1* | 12/2005 | Chen et al. | 257/411 |
| 2005/0271813 A1* | 12/2005 | Kher et al. | 427/248.1 |
| 2006/0001151 A1* | 1/2006 | Ahn et al. | 257/701 |
| 2006/0009039 A1* | 1/2006 | Fujii | 438/706 |
| 2006/0022252 A1 | 2/2006 | Doh et al. | |
| 2006/0043463 A1* | 3/2006 | Liu et al. | 257/316 |
| 2006/0051506 A1* | 3/2006 | Senzaki et al. | 427/248.1 |
| 2006/0051925 A1* | 3/2006 | Ahn et al. | 438/287 |
| 2006/0062917 A1* | 3/2006 | Muthukrishnan et al. | 427/248.1 |
| 2006/0084281 A1* | 4/2006 | Misra et al. | 438/778 |
| 2006/0154425 A1* | 7/2006 | Yang et al. | 438/287 |
| 2006/0194451 A1* | 8/2006 | Lee et al. | 438/786 |
| 2006/0208215 A1* | 9/2006 | Metzner et al. | 252/62.3 BT |
| 2006/0216953 A1* | 9/2006 | Nakajima et al. | 438/785 |
| 2006/0220106 A1* | 10/2006 | Choi et al. | 257/324 |
| 2006/0237803 A1* | 10/2006 | Zhu et al. | 257/410 |
| 2006/0261401 A1* | 11/2006 | Bhattacharyya | 257/316 |
| 2007/0029601 A1* | 2/2007 | Orimoto et al. | 257/315 |
| 2007/0045718 A1* | 3/2007 | Bhattacharyya | 257/324 |
| 2007/0049045 A1* | 3/2007 | Zimmerman et al. | 438/758 |
| 2007/0052011 A1* | 3/2007 | Bhattacharyya | 257/324 |
| 2007/0120179 A1* | 5/2007 | Park et al. | 257/324 |
| 2007/0190807 A1* | 8/2007 | Misra et al. | 438/785 |
| 2007/0272916 A1* | 11/2007 | Wang et al. | 257/24 |
| 2008/0044569 A1* | 2/2008 | Myo et al. | 427/248.1 |
| 2008/0076268 A1* | 3/2008 | Kraus et al. | 438/785 |
| 2008/0093643 A1* | 4/2008 | Park | 257/296 |
| 2008/0105918 A1* | 5/2008 | Jeon et al. | 257/324 |
| 2008/0135922 A1* | 6/2008 | Mitani et al. | 257/325 |
| 2008/0169520 A1* | 7/2008 | Kiyomura et al. | 257/411 |
| 2008/0217679 A1* | 9/2008 | Wu | 257/324 |
| 2008/0224238 A1* | 9/2008 | Kanakasabapathy et al. | 257/411 |
| 2008/0274626 A1* | 11/2008 | Glowacki et al. | 438/787 |
| 2008/0285344 A1* | 11/2008 | Ruttkowski et al. | 365/185.05 |

FOREIGN PATENT DOCUMENTS

| | | |
|---|---|---|
| KR | 1020040064965 A | 7/2004 |
| KR | 1020060108352 A | 10/2006 |

OTHER PUBLICATIONS

The Effects of Nitrogen in HfO2 for improved MOSFET performance, Microelectroelectronic =s research center.*

Callegari, A., et al., "Physical and electrical characterization of Hafnium oxide and Hafnium silicate sputtered films," *J. Appl. Phys.*, 90(12):6466-6575 (Dec. 15, 2001).

Conley, J. F., et al., "Pulsed deposition of metal—oxide thin films using dual metal precursors," *Appl. Phys. Lett.*, 84(3):398-400 (Jan. 19, 2004).

Frank, M., et al., "Hafnium oxide gate dielectrics grown from an alkoxide precursor: structure and defects," *Material Sci. and Engin.*, B109:6-10 (2004).

Lee, B.H., et al., "Thermal stability and electrical characteristics of ultrathin hafnium oxide gate dielectric reoxidized with rapid thermal annealing," *Appl. Phys. Lett.*, 76(14):1926-1928 (Apr. 3, 2000).

Minami, S.I., et al., A novel MONOS nonvolatile memory device ensuring 10-year data retention after $10^7$ erase/write cycles, *IEEE Trans. on Electron Devices*, 40(11):2011-2017 (Nov. 1993).

O'Connor, R., et al., "Reliability of HfSiON gate dielectrics," *Semicond. Sci. and Technol.*, 20:68-71 (2005).

Ritala, M., et al., "Atomic layer deposition of oxide thin films with metal alkoxides as oxygen sources," *Science*, 288(5464):319-321 (Apr. 14, 2000) (Abstract).

Song, M.K., et al., Direct liquid injection metal-organic chemical vapor deposition of $HfO_2$ thin films using Hf(dimethylaminoethoxide)$_4$, *Thin Solid Films*, 450:272-275 (2004).

Takahashi, K., et al., "Effect of deposition temperature on the characteristics of hafnium oxide films deposited by metalorganic chemical vapor deposition using amide precursor," *J. Mater. Res.*, 19(2):584-589 (Feb. 2004).

Triyoso, D.H., et al., "Physical and electrical characteristics of $HfO_2$ gate dielectrics deposited by ALD and MOCVD," *J. of the Electrochemical Society*, 152(3):G203-G209 (2005).

* cited by examiner

US 7,851,285 B2

NON-VOLATILE MEMORY DEVICE AND METHOD FOR FABRICATING THE SAME

CROSS-REFERENCE TO RELATED APPLICATION

The present application claims priority to Korean patent application number 10-2007-0037030, filed on Apr. 16, 2007, which is incorporated by reference in its entirety.

BACKGROUND OF THE INVENTION

The present invention relates to a non-volatile memory device and a method for fabricating the same.

Non-volatile memory devices for performing memory operations in the absence of an electric power have attracted much attention as next-generation semiconductor memory devices. In particular, flash memory devices employing a floating gate are widely utilized in a variety of applications. In addition, metal oxide nitride oxide semiconductor (MONOS) and silicon oxide nitride oxide semiconductor (SONOS) memory devices are being developed.

Floating gate memory devices perform memory operations via potential wells. Flash electrically erasable read only memory (EEPROM), e.g., EPROM tunnel oxide ($ET_{ox}$), is commonly used as a floating gate memory device. Metal insulator semiconductors (MISs), such as SONOS memories, utilize a gate dielectric film having a double- or triple-layered structure to realize a charge trapping structure. The charge trapping structure includes a triple-layered stack consisting of a charge tunneling layer, a charge trapping layer and a charge blocking layer. MIS-type memory devices perform memory operations utilizing charge traps present on a dielectric film bulk, an interface between adjacent dielectric films, or an interface between a dielectric film and a semiconductor.

Flash EEPROMs include one transistor in each memory cell. MONOS or SONOS devices used as full-featured EEPROMs may include a selective transistor in addition to the cell transistor in each memory cell to execute programming and erasing operations in a byte-unit. The selective transistor selects a memory cell so that programming and erasing operations can be carried out in a byte-unit. For this reason, memory functions are substantially performed by the cell transistor. Accordingly, the cell transistor may have a SONOS structure. For example, a cell transistor includes a gate dielectric film having an oxide nitride oxide (ONO) structure in which a silicon oxide film, a silicon nitride film and a silicon oxide film are sequentially stacked on a silicon (Si) semiconductor substrate. The cell transistor may further include a control gate arranged on the gate dielectric film.

In a charge trapping structure including an ONO stack, charge trapping is mainly carried out by the silicon nitride film. The reliability of the memory device greatly depends on the thickness and film quality of the silicon nitride film. To improve the reliability of the memory device, it is preferable that the silicon nitride film has a large thickness. However, the large thickness of the film makes it difficult to adjust a threshold voltage ($V_t$) to a desired level and requires a high voltage and power for programming. When deterioration of the film quality of the silicon nitride film occurs due to a variation (e.g., thinness) in the thickness thereof, charge leakage increases thereby decreasing charge retention time. As a result, the reliability of the memory device deteriorates. In an attempt to solve these problems, a charge trapping structure has been suggested that employs a charge trapping layer having a multi-layered (including a double-layered) stack consisting of a silicon oxide film and a silicon nitride film, and a dielectric film having a higher dielectric constant.

The introduction of the dielectric film having a higher dielectric constant into the charge trapping layer aims to reduce a device control voltage and improve current drivability. In addition, the introduction of the high-dielectric film is advantageous in reducing sub-threshold swing thereby decreasing defect density and improving reliability of the device. For example, a stacked structure including alumina, hafnia and alumina ($Al_2O_3/HfO_2/Al_2O_3$) in this order has been suggested.

When hafnia is deposited on alumina, sequential deposition of different kinds of oxide films involves a complicated fabrication process. In addition, an equipment structure to realize such a process is complicated, and maintenance and management for mass-production become difficult. Furthermore, these attempts involve a process for depositing an oxide film on the surface of a silicon substrate, thereby causing undesired oxidation on the surface of the silicon substrate. An amorphous silicon oxide film created by the oxidization of silicon has a low dielectric constant, as compared to alumina or hafnia, thereby causing an increase in the thickness of an equivalent oxide film of a charge tunneling layer in a charge trapping structure.

Accordingly, attempts have been made to develop non-volatile memory semiconductor devices capable of exhibiting prolonged data retention time, high processing speed and low driving voltage using simple methods, as compared to ONO structures.

BRIEF SUMMARY OF THE INVENTION

In accordance with one aspect of the present invention, a method for fabricating a non-volatile memory device includes forming a charge tunneling layer composed of a metal silicate layer on a semiconductor substrate. A charge trapping layer is formed on the charge tunneling layer. A charge blocking layer is formed on the charge trapping layer. A gate layer is formed on the charge blocking layer.

The formation of the charge tunneling layer may include adsorbing a silicon source on a surface of the semiconductor substrate. A metal source is introduced onto the adsorbed silicon source to form a metal silicide layer. The metal silicide layer is subject to oxidation via introduction of an oxidation source.

The silicon source may include a silane or silanol gas.

To allow the metal silicide layer to be composed of amorphous hafnium silicide ($HfSi_x$), the metal source may include a hafnium source.

The formation of the charge tunneling layer on a semiconductor substrate may include adsorbing a silicon source on the surface of the semiconductor substrate. A metal source is introduced onto the adsorbed silicon source to form a metal silicide layer. The metal silicide layer is subject to oxidation-nitration via introduction of an oxidation-nitration source containing oxygen and nitrogen to form a nitrogen-containing metal silicate layer.

The charge trapping layer may be composed of a hafnium oxide nitride ($HfO_xN_y$) layer or a hafnium silicate layer ($HfSi_xO_y$), each having a dielectric constant higher than that of the metal silicate layer.

The charge blocking layer may be composed of hafnium oxide.

The charge blocking layer may be composed of zirconium oxide ($ZrO_2$), titanium oxide ($TiO_2$), tantalum oxide ($Ta_2O_5$), aluminum oxide ($Al_2O_3$), cesium oxide ($CeO_2$), lanthanum oxide ($La_2O_3$), tungsten oxide ($WO_3$) or yttrium oxide ($Y_2O_3$).

The hafnium silicate layer may have a thickness of 5 nm or less.

The oxidation source may include an oxygen-containing gas including oxygen ($O_2$) or water ($H_2O$), and the oxygen-containing gas may be introduced onto the metal silicide layer in a plasma-excited state.

The formation of the hafnium silicate layer on a semiconductor substrate may include adsorbing a silicon source on the surface of the semiconductor substrate. A hafnium source is introduced onto the adsorbed silicon source to form a hafnium silicide ($HfSi_x$) layer. The hafnium silicide layer is subject to oxidation-nitration via introduction of an oxidation-nitration source in a plasma state to form a nitrogen-containing hafnium silicate ($HfSi_xO_yN_z$) layer.

The oxidation-nitration source may include a nitric oxide (NO) or nitrous oxide ($N_2O$) gas.

The hafnium oxide nitride ($HfO_xN_y$) layer may be formed by adsorbing a hafnium source onto the metal silicate layer, and subjecting the adsorbed hafnium source to oxidation-nitration via introduction of an oxidation-nitration source.

The formation of the hafnium oxide nitride ($HfO_xN_y$) layer may be carried out by subjecting the metal silicate layer to a nitration surface treatment via introduction of a nitration source in a plasma state, prior to adsorption of the hafnium source.

The oxidation-nitration source may include a mixed gas of oxygen and nitrogen, nitrous oxide ($N_2O$), or a mixed gas of ammonia ($NH_3$) and nitrous oxide ($N_2O$). The oxidation-nitration source may be introduced in a plasma-excited state.

The adsorption of the hafnium source and the introduction of the oxidation-nitration source may be repeated to increase the thickness of the hafnium oxide nitride ($HfO_xN_y$) layer to a desired level.

The hafnium oxide nitride ($HfO_xN_y$) layer may be subject to a subsequent plasma treatment by introducing oxygen ($O_2$), ozone ($O_3$), nitrogen ($N_2$), ammonia ($NH_3$), hydrazine ($N_2H_2$) or a combination thereof, in a plasma state.

The formation of the hafnium oxide nitride ($HfO_xN_y$) layer may be carried out by inducing adsorption of hafnium oxide nitride on the metal silicate layer via introduction of a hafnium source and an oxidation-nitration source.

The formation of the charge blocking layer on the charge trapping layer may include adsorbing a hafnium source on the hafnium oxide nitride layer, and subjecting the adsorbed hafnium source to oxidation via introduction of an oxidation source to form a hafnium oxide layer.

The adsorption of the hafnium source and the introduction of the oxidation source may be repeated. After the repetition, the hafnium oxide layer may be subject to oxygen plasma treatment to control the composition ratio of the hafnium oxide layer.

In accordance with another aspect of the present invention, a method for fabricating a non-volatile memory device includes forming a charge tunneling layer composed of a nitrogen-containing hafnium silicate layer on a semiconductor substrate. A charge trapping layer composed of a hafnium oxide nitride ($HfO_xN_y$) layer is formed on the charge tunneling layer. A charge blocking layer is formed on the charge trapping layer. A gate layer is formed on the charge blocking layer.

The formation of the nitrogen-containing hafnium silicate layer may include adsorbing a silicon source on the surface of the semiconductor substrate. A hafnium source is introduced onto the adsorbed silicon source to form a hafnium silicide ($HfSi_x$) layer. The hafnium silicide layer is subject to oxidation-nitration via introduction of an oxidation-nitration source.

The hafnium source may include tetrakis(diethylamino) hafnium (TDEAH, $Hf—(N(C_2H_5)_2)_4$) or tetrakis (ethylmethylamino) hafnium (TEMAH; $Hf[N(CH_3)C_2H_5]_4$).

In accordance with another aspect of the present invention, a method for fabricating a non-volatile memory device includes forming a charge tunneling layer composed of a first hafnium silicate ($HfSi_{x1}O_{y1}$) layer on the semiconductor substrate. A charge trapping layer is formed on the charge tunneling layer such that the charge trapping layer is composed of a second hafnium silicate ($HfSi_{x2}O_{y2}$) layer having a dielectric constant higher than that of the charge tunneling layer. A charge blocking layer is formed on the charge trapping layer. A gate layer is formed on the charge blocking layer.

The hafnium silicate layer may be formed by adsorbing a silicon source, introducing a hafnium source onto the adsorbed silicon source to form a hafnium silicide layer, and oxidizing the hafnium silicide via introduction of an oxidation source in a plasma state. When the silicon and oxidation sources are introduced, a chamber pressure and a plasma generation power may be varied such that the first hafnium silicate ($HfSi_{x1}O_{y1}$) has a composition range of $x_1 > y_1$, and the second hafnium silicate ($HfSi_{x2}O_{y2}$) has a composition range of $x_2 < y_2$.

The adsorption of the silicon source, the introduction of the hafnium source, and the introduction of the oxidation source may be repeated.

In accordance with another aspect of the present invention, a non-volatile memory device includes a charge tunneling layer formed on a semiconductor substrate. The charge tunneling layer is composed of a metal silicate layer. A charge trapping layer is formed on the charge tunneling layer. The charge trapping layer is composed of a metal oxide nitride layer. A charge blocking layer is formed on the charge trapping layer. The charge blocking layer is composed of a metal oxide layer. A gate layer is formed on the charge blocking layer.

The metal silicate layer may include a hafnium silicate ($HfSi_xO_y$) layer and the metal oxide nitride layer may include a hafnium oxide nitride ($HfO_xN_y$) layer. The metal silicate layer may include nitrogen-containing hafnium silicate ($HfSi_xO_yN_z$) in addition to hafnium silicate ($HfSi_xO_y$). The metal silicate layer may include nitrogen-containing hafnium silicate.

In accordance with yet another aspect of the present invention, a non-volatile memory device includes a charge tunneling layer formed on the semiconductor substrate. The charge tunneling layer is composed of a first hafnium silicate ($HfSi_{x1}O_{y1}$) layer. A charge trapping layer is formed on the charge tunneling layer. The charge trapping layer is composed of a second hafnium silicate ($HfSi_{x2}O_{y2}$) layer having a dielectric constant higher than that of the charge tunneling layer. A charge blocking layer is formed on the charge trapping layer. A gate layer is formed on the charge blocking layer.

The first hafnium silicate ($HfSi_{x1}O_{y1}$) layer may have a composition range of $x_1 > y_1$, and the second hafnium silicate ($HfSi_{x2}O_{y2}$) layer may have a composition range of $x_2 < y_2$.

In one aspect, the present invention is directed to a non-volatile memory semiconductor device capable of exhibiting prolonged data retention time, high processing speed and improved reliability.

DETAILED DESCRIPTION OF THE INVENTION

According to one embodiment of the present invention, a non-volatile memory device and a method for fabricating the device employ a charge trapping structure having a stack consisting of three high-dielectric layers. The charge trapping structure consisting of a charge tunneling layer, a charge trapping layer and a blocking layer prevents formation of a silicon oxidation layer on a surface of a silicon substrate.

The composition of the three layers may be changed depending on a variation in deposition temperature and composition ratio to provide the constituent layers with different dielectric constants. Thus, a difference in energy band gap between the layers occurs. Accordingly, a charge trap is created via an energy well structure.

As a result, an undesired increase can be prevented in the thickness of an equivalent oxide film, which is caused by formation of a silicon oxide film on an interface between a silicon semiconductor substrate and a charge tunneling layer. By varying the composition and deposition temperature of dielectric films, electrical properties of different devices can be optimized.

FIGS. 1 to 12 are cross-sectional views illustrating a non-volatile memory device and a method for fabricating the device according to one embodiment of the present invention.

Figure 1:
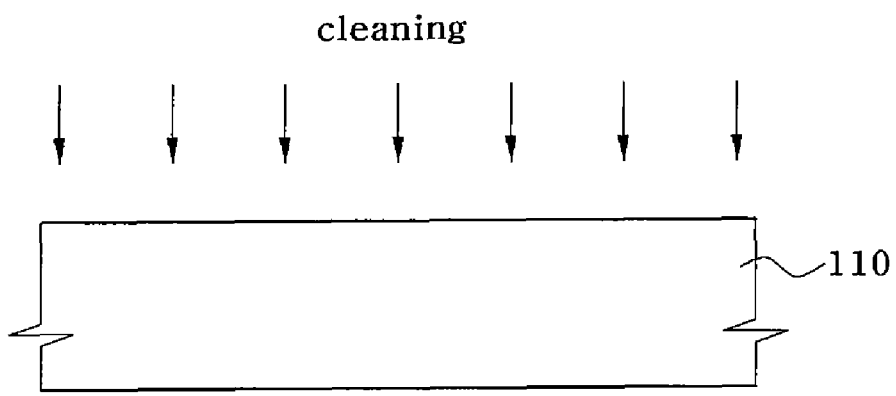
FIGS. 1 to 12 are cross-sectional views schematically illustrating a non-volatile memory device and a method for fabricating the device, according to one embodiment of the present invention.

Referring to FIG. 1, a semiconductor substrate 110 is subject to surface-cleaning and drying. For example, the surface of a silicon semiconductor substrate is cleaned using an RCA wet cleaning method. The RCA wet cleaning is carried out using a cleaning solution consisting of pure water ($H_2O$), a 29% ammonium hydroxide ($NH_4OH$) aqueous solution and a 30% hydrogen peroxide ($H_2O_2$) aqueous solution in a ratio of about 5:1:1 at approximately 70° C. to 80° C. for about 5 minutes. The resulting semiconductor substrate 110 is rinsed using deionized water and dried with a nitrogen ($N_2$) gas. Prior to the surface-cleaning and drying, a process for forming a device isolation structure on the semiconductor substrate 110 (e.g., shallow trench isolation; STI) may be carried out.

Figure 2:
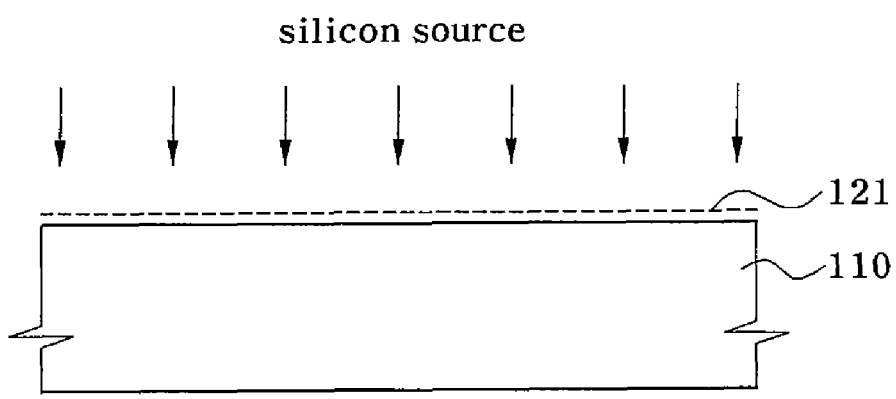

Referring to FIG. 2, a silicon source adsorption layer 121 is formed on the semiconductor substrate 110. The silicon source adsorption layer 121 functions as a source layer for supplying silicon (Si) atoms to a tunneling layer and an oxidation blocking layer for preventing oxidation of silicon present on the surface of the underlying semiconductor substrate 110. The silicon source adsorption layer 121 blocks undesired oxidation of the surface of the underlying semiconductor substrate 110 by inhibiting or preventing oxidation gas, which is derived from oxidation involved in the formation of the tunneling layer, from permeating onto the surface of the semiconductor substrate 110.

The formation of the silicon source adsorption layer 121 is carried out by introducing a silicon source onto the surface of the semiconductor substrate 110 and inducing adsorption of the silicon source thereon. For example, a silicon-containing gas such as a silane gas (e.g. $SiH_4$ or $Si_2H_6$) is introduced onto the surface of the semiconductor substrate 110 to render the silane gas to be chemically adsorbed thereon.

Since an efficient adsorption amount of the silane gas varies depending upon the exposure time of the semiconductor substrate 110 to the silicon source and the pressure of a processing chamber equipped with the semiconductor substrate 110, the thickness of an oxidation blocking layer including the silicon source adsorption layer 121 can be controlled. A formation process of the silicon source adsorption layer 121 is controlled while taking into consideration the permeation depth of the oxidation gas upon forming the tunneling layer. For example, exposure time and pressure conditions to form the silicon source adsorption layer 121 are controlled while taking into consideration the diffusion depth of oxygen. As a result, the thickness of the silicon source adsorption layer 121 can be adjusted to a desired level so that the silicon source adsorption layer 121 efficiently prevents diffusion of oxygen. The silicon source adsorption layer 121 inhibits undesired oxidation of silicon present on the surface of the semiconductor substrate 110 during an oxidation reaction involved in the formation of the tunneling layer. When a silicon oxide film is formed on the surface of the semiconductor substrate 110 due to an oxidation reaction, the thickness of an equivalent oxide film may unexpectedly increase. When hafnia ($HfO_2$) is deposited to a thickness of approximately 132 Å on the Si substrate 100 by atomic layer deposition (ALD) at 500° C., it can be confirmed from the analysis of a transmission electron microscope (TEM) that an amorphous silicon oxide layer with a thickness of about 23 Å is formed on the Si substrate 100. The formation of the amorphous silicon oxide layer results in an increase in the thickness of an equivalent oxide film and causes deterioration of SONOS memory device characteristics.

In the one embodiment of the present invention, the induction of the silicon source adsorption layer 121 on the surface of the semiconductor substrate 110 is carried out prior to formation of the tunneling layer. As a result, the oxidation blocking function of the silicon source adsorption layer 121 enables prevention of oxidation on the surface of the underlying semiconductor substrate 110. Accordingly, an increase in the thickness of an equivalent oxide film can be avoided by preventing formation of an amorphous silicon oxide layer on an interface between the tunneling layer and the surface of the semiconductor substrate 110.

Figure 3:
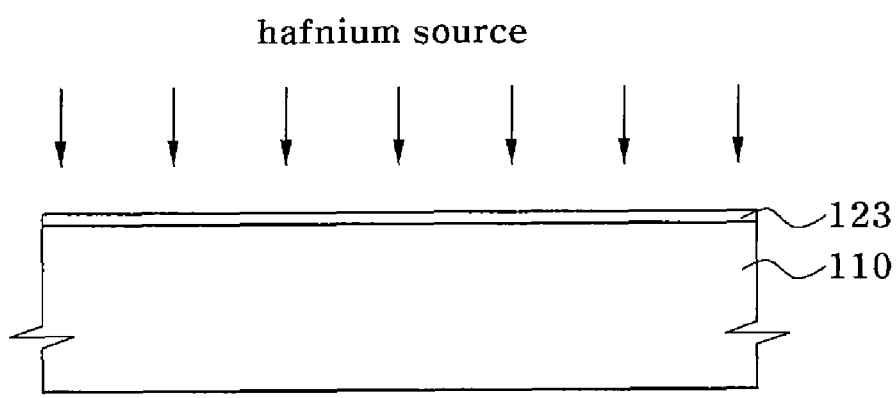

Referring to FIG. 3, a metal-containing source (e.g., a hafnium source) is introduced onto the silicon source adsorption layer (designated by reference numeral "121" in FIG. 2) to induce the metal-containing source to react with the silicon source of the silicon source adsorption layer 121. As a result, a hafnium silicide layer 123 is formed on the surface of the semiconductor substrate 110. The hafnium source may be, for example, tetrakis(diethylamino)hafnium (TDEAH, Hf—(N($C_2H_5$)$_2$)$_4$) or hafnium nitride compounds represented by a chemical structure of Hf—N—R (wherein R is alkane, alkene or alkyne). Other examples of suitable hafnium sources include hafnium iodine ($HfI_4$), hafnium chloride ($HfCl_4$), hafnium nitrate ($Hf(NO_3)_4$), hafnium t-butoxide ($Hf(OC_4H_9)_4$), and tetrakis (ethylmethylamino) hafnium (TEMAH; $Hf[N(CH_3)C_2H_5]_4$).

The deposition temperature depends on the type of the hafnium source. The introduction of the hafnium source is carried out at a deposition temperature of about 700° C. or less, and preferably, about 500° C. or less to induce the reaction of hafnium silicide. TDEAH is preferably used as the hafnium source because it can be deposited at 300° C. to 600° C. and become volatile at about 80° C. and 1 Torr.

Figure 4:
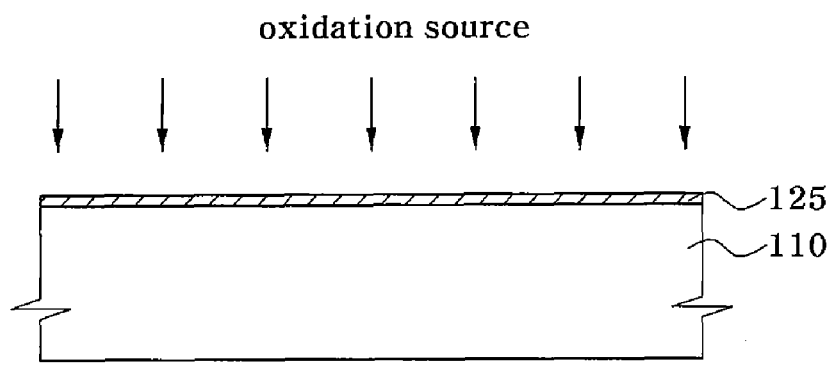

Referring to FIG. 4, the hafnium silicide layer (designated by a reference numeral "123" in FIG. 3) is composed of a relatively instable amorphous film created by the reaction between the hafnium source and the silicon source. An oxidation source is introduced onto the hafnium silicide layer 123 to form a hafnium silicate ($HfSiO_x(x \leq 4)$) layer 125. The oxidation source, i.e., "an oxygen-containing gas", may include oxygen ($O_2$) or water ($H_2O$). The oxidation source may be introduced in a plasma state. Plasma excitation is carried out using a remote plasma method to prevent plasma from causing damage to the film. The oxygen-containing gas induces oxidation of the hafnium silicide layer 123 to form a hafnium silicate layer 125.

The hafnium silicate layer 125 may be formed while taking into consideration the depth to which the oxygen-containing gas or oxygen is diffused. More specifically, during formation of the hafnium silicate layer 125 via the reaction of the oxygen-containing gas with the instable amorphous hafnium silicide layer 123, the hafnium silicate layer 125 may be formed to a thickness of about 5 nm in view of the depth to which oxygen is permeated or diffused. The thickness depends upon a critical thickness to which an oxygen element or radical in a gas or plasma state is diffused into an amorphous material and permeated thereinto.

During the formation of the hafnium silicate layer 125, the introduction of the oxygen-containing gas subsequent to the hafnium source is effective in preventing undesired oxidation on the surface of the underlying semiconductor substrate 110. This is because an oxygen diffusion speed is reduced by a covalent bond of oxygen with silicon contained in the hafnium silicate.

To more efficiently lower the oxygen diffusion speed, the oxygen-containing gas may further comprise nitrogen. For example, a nitric oxide (NO) or nitrous oxide ($N_2O$) gas is used as the oxygen-containing gas. Alternatively, an NO or $N_2O$ gas is simultaneously or separately introduced in addition to the oxygen-containing gas so that nitrogen is incorporated into the hafnium silicate layer 125.

The hafnium silicate layer 125 may be substantially composed of nitrogen-containing hafnium silicate ($HfSi_xO_yN_z$) or may be formed of a nitrogen-containing hafnium silicate layer. Hafnium oxide ($HfO_2$) contained in hafnium silicate ($HfSiO_2$) has a lattice structure that does not include an open lattice. However, the addition of nitrogen enables a reduction of network diffusion of oxygen in the lattice structure of hafnium silicate ($HfSiO_2$). As a result, diffusion of oxygen can be efficiently inhibited, and formation of undesired silicon oxide ($SiO_2$) by unexpected oxidation on an interface between the hafnium silicate layer 125 and the surface of the semiconductor substrate 110 can be prevented or reduced.

The oxygen-containing gas introduced subsequent to the hafnium source is effective in reinforcing the amorphous transition of hafnium silicate. This is because the oxygen-containing gas is deposited on amorphous silicon hydride ($SiH_x$) contained in the silicon source adsorption layer (designated by reference numeral "121" in FIG. 2) formed on the surface of the underlying semiconductor substrate 110.

The band gap and dielectric constant (k) of the hafnium silicate layer 125 vary depending on the concentration of the silicon atoms contained therein. In other words, by controlling the concentration of silicon atoms, the dielectric constant of the hafnium silicate layer 125 can be adjusted to a desired level. When nitrogen atoms are further introduced, the energy band gap and the dielectric constant of the hafnium silicate layer 125 can be controlled in accordance with the concentration of nitrogen atoms.

Preferably, the hafnium silicate layer 125 has a dielectric constant of about 9 to 12 so that it can be used as a tunneling layer of a non-volatile memory device. To adjust the dielectric constant of the hafnium silicate layer 125 to the desired level, the hafnium silicate layer 125 is further subject to a surface treatment using a silicon source (e.g., a silane gas). Preferably, the surface treatment is carried out using a silicon source excited to a plasma state. The surface treatment with the silicon source is carried out by a dry process at about 800° C. to 1,000° C. for 15 minutes. As the concentration of silicon in the hafnium silicate layer 125 increases, the hafnium silicate layer 125 secures a strong amorphous tendency, a low dielectric constant, superior thermal stability and low leakage, as compared to hafnium oxide ($HfO_2$) layers.

The introduction of the silicon source and the introduction of the hafnium source, respectively described with reference to FIGS. 2 and 3, may be repeated. Another source, e.g., silanol sources such as tertiary-buthyldimethylsilanol (t-ButMe$_2$SiOH), may be used instead of the silane source. Thus, the concentration of silicon can be readily controlled.

Figure 5:
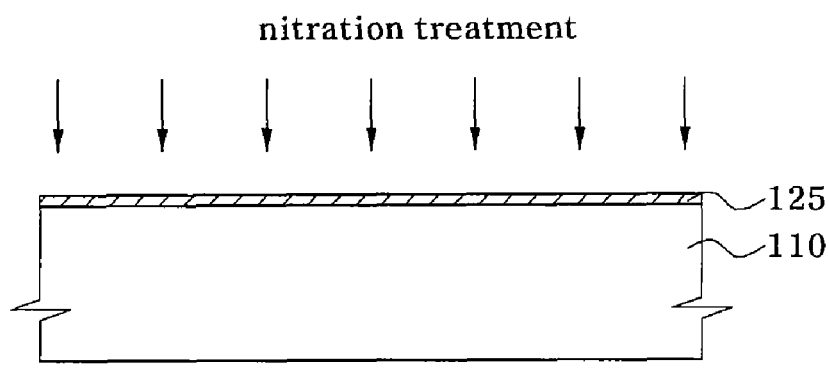

Referring to FIG. 5, a charge trapping layer is formed on the hafnium silicate layer 125. More specifically, nitration treatment is performed on the surface of the hafnium silicate layer 125 to more efficiently improve thermal stability and current leakage characteristics. For example, the nitration surface treatment of the hafnium silicate layer 125 is carried out by a plasma treatment using a nitrogen ($N_2$), ammonia ($NH_3$) or nitrous gas, etc., or direct exposure to hydrazine ($N_2H_2$).

Figure 6:
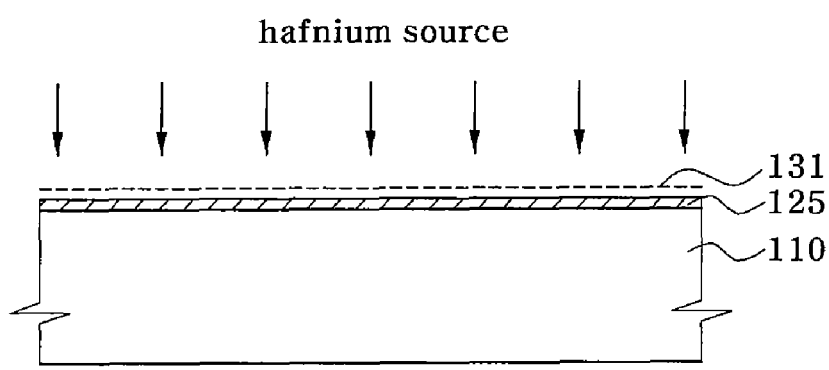

Referring to FIG. 6, a hafnium source adsorption layer 131 is formed on the resulting hafnium silicate layer 125. For example, a nitrogen-containing hafnium source such as TDEAH or Hf(OSiBuMe$_2$)$_4$(Et$_2$NH) in a gaseous state is introduced onto the hafnium silicate layer 125 to adsorb a predetermined amount of the hafnium source on the surface thereof.

Figure 7:
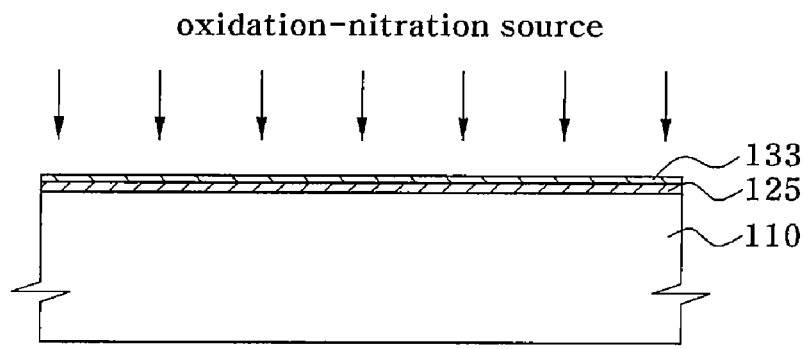

Referring to FIG. 7, the hafnium source adsorption layer 131 is subject to oxidation-nitration via introduction of an oxidation-nitration source to form a hafnium oxide nitride ($HfO_xN_y$) layer 133. The introduction of the oxidation-nitration source to induce oxidation-nitration of the hafnium source adsorption layer 131 is carried out using a mixed gas of oxygen and nitrogen, nitrous oxide ($N_2O$), or a mixed gas of ammonia ($NH_3$) and ($N_2O$). The oxidation-nitration source may be introduced in a plasma state. The introduction of plasma may be carried out by a remote plasma method. By controlling the introduction time and flow amount of the oxidation-nitration source, the thickness of the hafnium oxide nitride ($HfO_xN_y$) layer 133 can be adjusted to a desired level.

When HfI$_4$ containing no nitrogen is used as the hafnium source, the deposition may be induced by direct reaction of HfI$_4$ with a oxide nitride gas such as a mixed gas of ammonia ($NH_3$) and oxygen ($O_2$), a mixed gas of nitrogen ($N_2$) and oxygen ($O_2$), nitric oxide (NO) or nitrous oxide ($N_2O_2$). Alternatively, the oxide nitride gas is excited to a plasma state to react with the adsorbed hafnium source. Furthermore, when (bis(tert-butylamino)silane) (BTBAS; $C_8H_{22}N_2Si$) is used as a nitrogen source, more defect sites are created in hafnium oxide nitride. As a result, the hafnium oxide nitride ($HfO_xN_y$) layer 133 has a wide threshold voltage window, as compared to silicon nitride layers which are applied to ONO structures.

Figure 8:
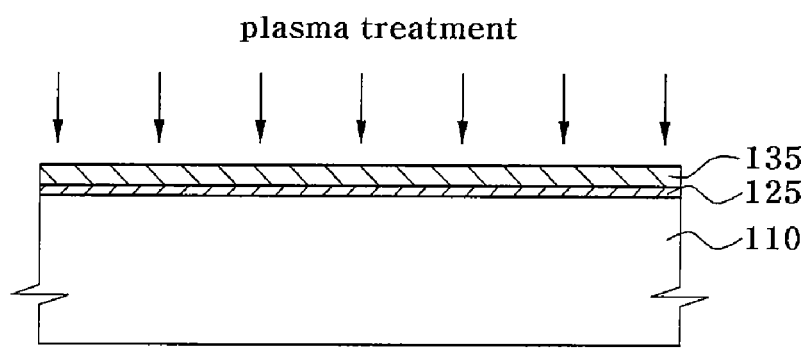

Referring to FIG. 8, another hafnium oxide nitride ($HfO_xN_y$) layer (designated by reference numeral "133" in FIG. 7) is deposited on the resulting structure by repeating the process for forming the hafnium oxide nitride (HfO$_x$N$_y$) layer, i.e., a reaction of the hafnium source adsorption layer (designated by reference numeral "131" in FIG. 6) with the oxidation-nitration source. As a result, a hafnium oxide nitride (HfO$_x$N$_y$) layer 135 serving as a charge trapping layer is formed on the hafnium silicate layer 125 such that it has a thickness increased to a desired level.

After the formation of the hafnium oxide nitride (HfO$_x$N$_y$) layer 135, post-treatment is further performed to control the composition of the hafnium oxide nitride (HfO$_x$N$_y$) layer 135. For example, the hafnium oxide nitride (HfO$_x$N$_y$) layer 135 is subject to plasma treatment at a temperature different from the deposition temperature. Surface-treatment is carried out by plasma-exciting an oxygen or ozone gas. Alternatively, a nitrogen or ammonia gas, a hydrazine (N$_2$H$_2$) gas, or a mixed gas of oxygen and nitrogen may be used, instead of the oxygen or ozone gas.

The composition ratio of oxygen and nitrogen in the hafnium oxide nitride (HfO$_x$N$_y$) layer 135 can be adjusted to a desired level by controlling the gas ratio of the oxygen to nitrogen. When hafnium oxide nitride is formed by adding nitrogen to hafnium oxide, a variation in band gap can also be realized in accordance with the nitrogen concentration. The hafnium oxide nitride (HfO$_x$N$_y$) layer 135 is formed such that it has a dielectric constant of about 13 to 16. In addition, the plasma surface-treatment requires low temperature conditions, as compared to furnace heating. For this reason, undesired crystallization of the hafnium oxide nitride (HfO$_x$N$_y$) layer 135 can be avoided while controlling the composition. As a result, improvement in leakage current characteristics and stability can be efficiently secured.

Figure 9:
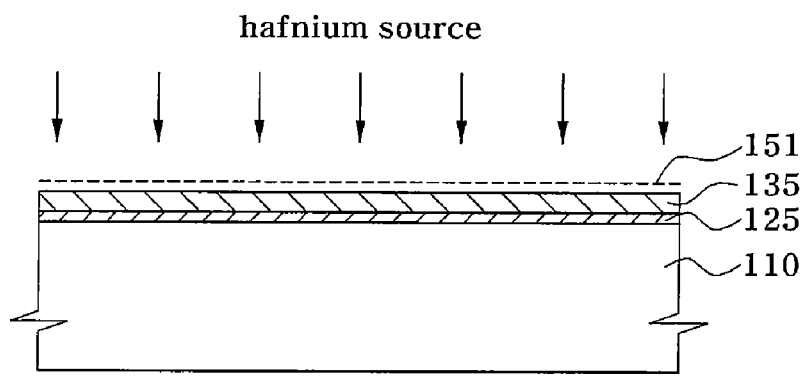

Referring to FIG. 9, a charge blocking layer is formed on the charge trapping layer of the hafnium oxide nitride (HfO$_x$N$_y$) layer. The charge blocking layer prevents charges trapped onto the charge trapping layer from flowing into the gate. The charge blocking layer may be composed of a high-dielectric material. Examples of suitable high-electric materials include zirconium oxide (ZrO$_2$), titanium oxide (TiO$_2$), tantalum oxide (Ta$_2$O$_5$), aluminum oxide (Al$_2$O$_3$), cesium oxide (CeO$_2$), lanthanum oxide (La$_2$O$_3$), tungsten oxide (WO$_3$) and yttrium oxide (Y$_2$O$_3$).

Taking into consideration the fact that the hafnium oxide nitride (HfO$_x$N$_y$) layer 135 is used as a charge trapping layer, the blocking layer is preferably composed of hafnium oxide. When the charge blocking layer includes hafnium oxide (HfO$_2$), a charge trapping structure is formed between a gate and the semiconductor substrate 110 in a transistor of a non-volatile memory device such that it has a stack including a plurality of layers composed of one or more of the same elements. Since a process for depositing layers containing the same elements is performed, an overall deposition process for stacking layers can be simplified, and, in particular, a consecutive process can be utilized with a single piece of equipment. As a result, a reduction in fabrication costs can be realized.

A hafnium adsorption layer 151 is formed on the hafnium oxide nitride (HfO$_x$N$_y$) layer 135 by introducing hafnium source thereto. The formation of the hafnium adsorption layer 151 is carried out by introducing a source (e.g., TDEAH or HfI$_4$), which can be deposited at a relatively low temperature, onto the hafnium oxide nitride (HfO$_x$N$_y$) layer 135 and inducing adsorption of the source thereon. An adsorption or introduction time of the hafnium source and a chamber pressure are controlled depending on the desired thickness of the hafnium adsorption layer 151.

Figure 10:
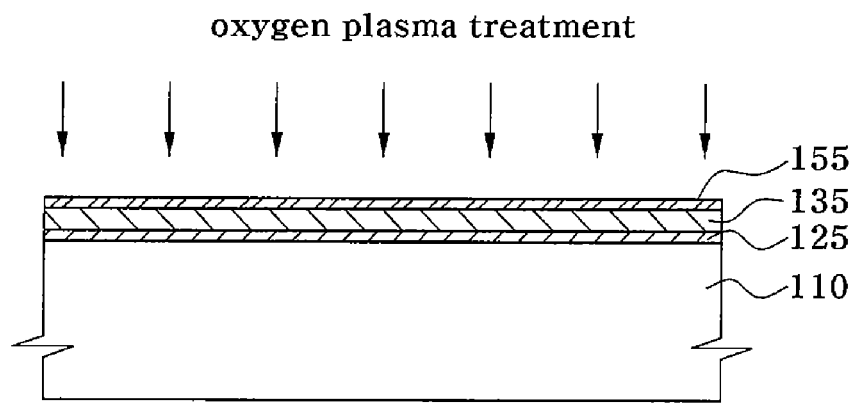

Referring to FIG. 10, an oxidation source is introduced onto the hafnium adsorption layer 151 to induce oxidation thereof. The oxidation of the hafnium adsorption layer 151 is carried out by introducing oxygen or ozone as the oxidation source onto the surface of the hafnium adsorption layer 151 for a predetermined time. When the hafnium oxide layer 151 has an insufficient thickness, a series of adsorption and oxidation processes are repeated to form a hafnium oxide layer 155 having a desired thickness. The hafnium oxide layer 155 is subject to plasma treatment using an oxidation source (e.g., oxygen or an oxygen-containing gas) to control the composition of hafnium oxide contained in the hafnium oxide layer 155. The oxygen plasma treatment enables the composition of hafnium oxide to be at a level required as a material for a device. For example, the dielectric constant of the hafnium oxide layer 155 is adjusted at about 17 to 20. X and Y of Hf$_x$O$_y$ have a nonstoichiometric value. More specifically, x is adjusted to about 0.75 to 1.5 and y is adjusted to about 1.5 to 3.0. The oxygen plasma treatment aims to increase/decrease the dielectric constant of hafnium oxide utilizing the dependency of the dielectric constant on the deposition temperature and composition, thereby securing a suitable dielectric constant required to improve device characteristics.

When chemical vapor deposition (CVD) is used to deposit hafnium oxide, the dielectric constant of the hafnium oxide layer increases from about 10.5 to 17.2 or more at a deposition temperature of about 300° C. or higher. When atomic layered deposition (ALD) is used to deposit hafnium oxide, the hafnium oxide layer has a dielectric constant comparable to the case of CVD at a lower temperature. For example, the use of ALD secures a deposition rate of approximately 0.075±0.007 nm/cycle at a deposition temperature of about 225° C. to 500° C. The use of CVD secures a deposition rate of approximately 0.5 to 90 nm/min at a deposition temperature of about 300° C. to 700° C.

The plasma treatment contributes to a stable realization in the dielectric constant of the deposition film via a controlled composition. The plasma treatment is effective because it can be carried out at a low temperature, as compared to furnace thermal treatment. In other words, hafnium oxide can be crystallized by plasma-excited reactants at a lower temperature. When more accurate control of the composition and thickness of the hafnium oxide layer 155 is needed, the hafnium oxide layer 155 is formed to a minimum thickness where a continuous, undivided film can be secured, and is subject to plasma treatment. Plasma treatment is introduced in the interval between repeated depositions including a series of adsorption and oxidation, thereby enabling more accurate control of the composition of the hafnium oxide layer 155. In addition, a non-uniform variation in the dielectric constant of the hafnium oxide layer 155 may be caused by plasma damage thereto. To reduce plasma damage, the plasma treatment is preferably carried out using remote plasma as a plasma source at a lower plasma generation power.

Figure 11:
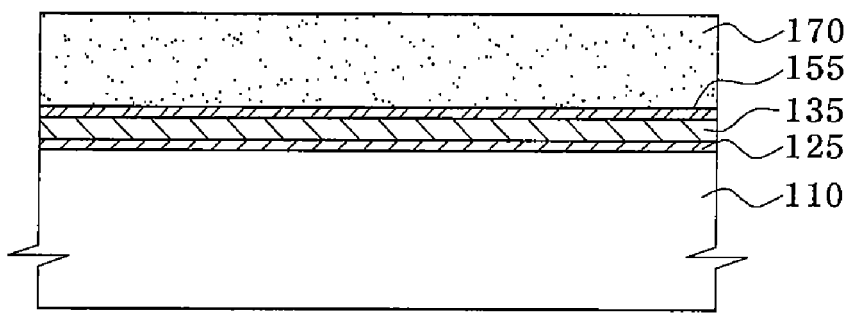

Referring to FIG. 11, a gate layer 170 of a non-volatile memory transistor is formed on the hafnium oxide layer 155 serving as the charge blocking layer. The gate layer 170 may be a conductive polysilicon layer or a metal layer composed of a metal, e.g., tungsten (W).

Figure 12:
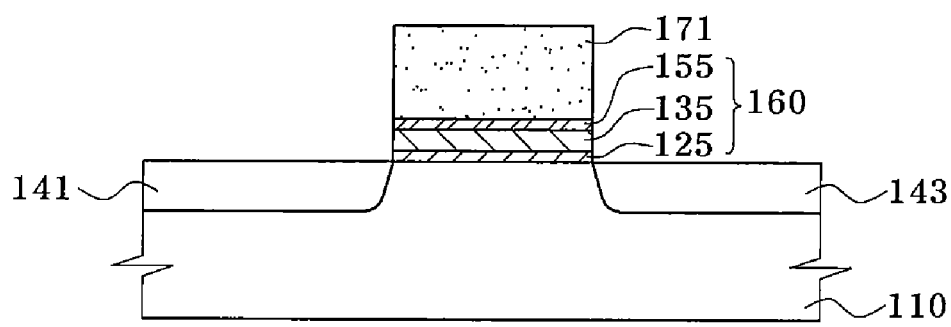

Referring to FIG. 12, the gate layer 170, the underlying hafnium oxide layer 155, the hafnium oxide nitride layer 135, and the hafnium silicate layer 125 are patterned using photolithographic and etch processes. As a result, a gate 171 and a charge trapping stack 160 are formed on the semiconductor substrate 110. A source region 141 and a drain region 143 are formed on the exposed region of the semiconductor substrate 110 to realize a memory cell transistor structure of a non-volatile memory device.

Similar to the variations in an optical energy band gap and a dielectric constant depending on the concentration of silicon (Si) in hafnium silicate, when hafnium oxide nitride is formed by adding nitrogen to hafnium oxide, the optical energy band gap and dielectric constant may also be varied depending on the concentration of nitrogen (N). Accordingly, when three layers constituting the charge trapping stack 160 have different compositions and composition ratios, an energy well may be created between the layers. To prevent such a phenomenon, in each process for forming constituent layers of the charge trapping stack 160, plasma treatment using oxygen, nitrogen or a compound thereof is repeated on the charge trapping stack 160, after the deposition to a predetermined thickness. As a result, by adjustment of the composition and composition ratio of the constituent layer to a desired level, the energy band gap of the constituent layer can be suitably controlled. Therefore, by offsetting the difference in a band gap between the constituent layers of the charge trapping stack, memory devices can secure optimized electrical properties.

When the formation of the hafnium oxide nitride layer is carried out using a nitrogen-containing hafnium source (e.g., TDEAH), a relatively high vapor pressure can be obtained at a relatively low temperature, thereby effectively inducing a low-temperature reaction. A nitrous oxide or oxygen gas can be used for oxidation. When organic chemical vapor deposition (MOCVD) is used, the deposition is carried out under conditions of about 300° C. to 410° C. and approximately 2 Torr. Since TDEAH is gasified at about 95° C., dry helium (He) may be introduced as a carrier gas at a flow rate of about 0.03 to 0.06 ml/min. Although MOCVD is performed using $N_2O$ or $O_2$ as an oxidation source, the composition of the deposited hafnium oxide nitride is not greatly dependent upon the oxidant, $N_2O$ or $O_2$. When an oxygen gas is used as an oxidant, hafnium oxide nitride has a concentration of nitrogen substantially equivalent to when $N_2O$ is used as the oxidant. It may be construed that nitrogen (N) of TDEAH exists as impurities in a thin film, rather than when nitrogen (N) of $N_2O$ is incorporated in the thin film by the reaction.

A thermal energy-dependency method such as MOCVD or ALD makes it difficult to intentionally adjust the composition of the thin film to be suitable for use in low temperature conditions. According to one embodiment of the present invention, a main reactant is adsorbed on the resulting structure to a predetermined thickness, and a separate plasma source treatment is performed thereon under different pressure and time conditions. As a result, the composition of hafnium oxide nitride can be secured to a wider range. In other words, the content of nitrogen in hafnium oxide nitride or hafnium silicate can be intentionally controlled by separate nitride plasma treatment. Therefore, the dielectric constant of hafnium oxide nitride layers or hafnium silicate (or nitrogen-containing hafnium silicate) layers can be adjusted to a desired level.

As can be seen from FIG. 12, the charge trapping stack of the non-volatile memory device according to one embodiment of the present invention includes a hafnium silicate layer 125 acting as a tunneling layer. The hafnium silicate layer 125 may be typically represented by a chemical formula "$HfSi_xO_y$". The process where the silicon source adsorption layer 121 is deposited prior to introduction of a hafnium source, as mentioned with reference to FIG. 2, can be applied when using another metal oxide film as a tunneling layer instead of the hafnium silicate layer 125. Thus, undesired variation in the thickness of an equivalent oxide film can be prevented. When a nitrogen-containing hafnium silicate ($HfSi_xO_yN_z$) layer is formed by adding nitrogen to the hafnium silicate layer 125, the undesired variation in the thickness can be more efficiently prevented.

FIGS. 13 to 16 are cross-sectional views illustrating a non-volatile memory device and a method for fabricating the device according to another embodiment of the present invention.

Figure 13:
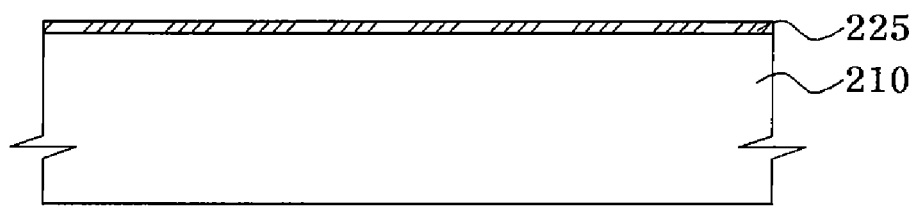
FIGS. 13 to 16 are cross-sectional views schematically illustrating a non-volatile memory device and a method for fabricating the device, according to another embodiment of the present invention.

Referring to FIG. 13, a silicon semiconductor substrate 210 is subject to surface cleaning and drying. A silicon source adsorption layer is formed on the silicon semiconductor substrate 210. The formation of the silicon source adsorption layer is carried out by introducing a silicon source, e.g., a silane gas (such as $SiH_4$ or $Si_2H_6$), or tertiary-buthyldimethylsilanol (t-$ButMe_2SiOH$), onto the surface of the silicon semiconductor substrate and inducing chemical adsorption of the silicon source on the surface thereof. Since an efficient adsorption amount of the silicon source varies depending on the exposure time of the semiconductor substrate 210 to the silicon source and the pressure of a processing chamber equipped with the semiconductor substrate 210, the thickness of an oxidation blocking layer including the silicon source adsorption layer 121 can be controlled. In addition, the composition ratio of silicon with respect to the tunneling layer can be controlled by varying the adsorption amount of the silicon source.

A hafnium (Hf) source is introduced onto the silicon source adsorption layer to induce the reaction of the hafnium (Hf) source with the silicon source of the silicon source adsorption layer. As a result, hafnium silicide is created. Tetrakis (diethylamino) hafnium (TDEAH, $Hf$—$(N(C_2H_5)_2)_4$) or $HfI_4$ may be used as the hafnium source. A tunneling layer 225 composed of first hafnium silicate ($HfSi_{x1}O_{y1}$) is formed by introducing an oxidation source onto a relatively instable amorphous hafnium silicide which is created by the reaction between the hafnium source and the silicon source. The oxidation source, i.e., "an oxygen-containing gas", may include $O_2$ or $H_2O$. The oxidation source may be introduced in a plasma state. Other examples of the oxygen-containing gas may include a nitric oxide (NO) or nitrous oxide ($N_2O$) gas. Alternatively, an NO or $N_2O$ gas may be simultaneously or separately introduced in addition to the oxygen-containing gas.

The step of introducing the silicon source and the step of introducing the hafnium source may be repeated. The silicon source used in each step may be different. As a result, the concentration of silicon in the tunneling layer 225 can be readily controlled.

Figure 14:
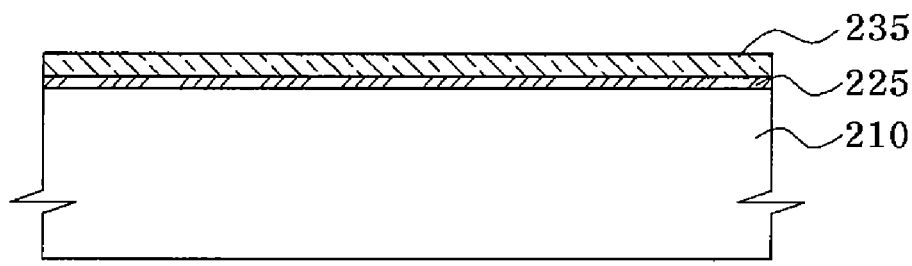

Referring to FIG. 14, a charge trapping layer 235 composed of second hafnium silicate ($HfSi_{x2}O_{y2}$) is formed on the tunneling layer 225. The charge trapping layer 235 is formed in the same manner as the tunneling layer 225. More specifically, the formation of the charge trapping layer 235 is carried out by sequentially introducing a silicon source, a hafnium source and an oxidation source. These introduction processes may be repeated to adjust the requirement and composition ratio of the charge trapping layer 235 to a desired level. By controlling the source introduction time and pressure in each process, the composition ratio of second hafnium silicate ($HfSi_{x2}O_{y2}$) is adjusted to be different from that of first hafnium silicate ($HfSi_{x1}O_{y1}$). The change in the composition ratio renders the charge trapping layer 235 composed of the second hafnium silicate ($HfSi_{x2}O_{y2}$) to have a dielectric constant higher than that of the tunneling layer 225 composed of the first hafnium silicate ($HfSi_{x1}O_{y1}$).

The charge trapping layer 225 traps charges. The source introduction conditions (e.g., time, pressure) and deposition conditions (e.g., temperature) of the first hafnium silicate ($HfSi_1Oy_1$) are controlled such that the first hafnium silicate ($HfSi_1Oy_1$) has a composition range of $x_1>y_1$. The deposition conditions of the second hafnium silicate ($HfSix_2Oy_2$) are controlled such that the second hafnium silicate ($HfSix_2Oy_2$) has a composition ratio of $x_2<y_2$. Hafnium oxide has a dielectric constant higher than that of hafnium silicate. Accordingly, hafnium silicate is preferably formed such that it has a dielectric constant in accordance with a reduction in the concentration of silicon in a constant hafnium concentration. The tunneling layer 225 is formed such that it has a dielectric constant of approximately 9 to 12. The charge trapping layer 235 is formed such that it has a dielectric constant of approximately 13 to 16.

For stabilization of the charge trapping layer 225, the charge trapping layer 225 may be further subject to nitration surface treatment, before or after the deposition thereof.

Figure 15:
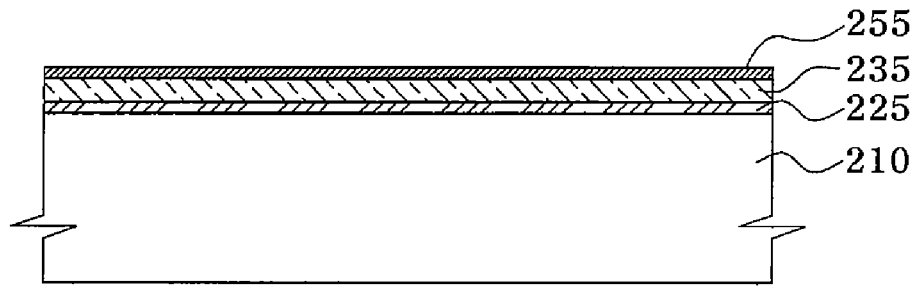

Referring to FIG. 15, a charge blocking layer 255 is formed on the charge trapping layer 235. The charge blocking layer 255 prevents charges trapped onto the charge trapping layer 235 from flowing into the gate. The charge blocking layer 255 may be composed of a high-dielectric material. However, it is preferable to use hafnium oxide ($HfO_2$) rather than a high-dielectric material.

When the charge blocking layer includes hafnium oxide ($HfO_2$), a charge trapping structure is formed between a gate and the semiconductor substrate 210 in a transistor of a non-volatile memory device such that it has a stacked structure including a plurality of layers composed of one or more of the same elements. Since a process for stacking layers containing the same elements is performed, an overall deposition process for stacking layers can be simplified, and, in particular, a consecutive process can be utilized in a single piece of equipment. As a result, a reduction in fabrication costs can be realized.

A hafnium adsorption layer is formed on the hafnium oxide nitride ($HfO_xN_y$) layer 235 by introducing a hafnium source thereto. The hafnium adsorption layer is oxidized by introduction of an oxidation source to form a hafnium oxide layer. When the hafnium oxide layer 255 has an insufficient thickness, a series of the adsorption and oxidation processes is repeated to adjust the thickness of the hafnium oxide layer 255 to a desired level and utilize the hafnium oxide layer 255 as a blocking layer 255. The dielectric constant of the blocking layer 255 is adjusted to approximately 17 to 20. X and Y of $Hf_xO_y$ have a nonstoichiometric value. More specifically, x is adjusted to approximately 0.75 to 1.5, and y is adjusted to approximately 1.5 to 3.0. An oxygen plasma treatment may be introduced to secure a desired dielectric constant required for improvement of device characteristics, via an increase/decrease in the dielectric constant of hafnium oxide utilizing the dependency of the dielectric constant on the deposition temperature and composition.

Figure 16:
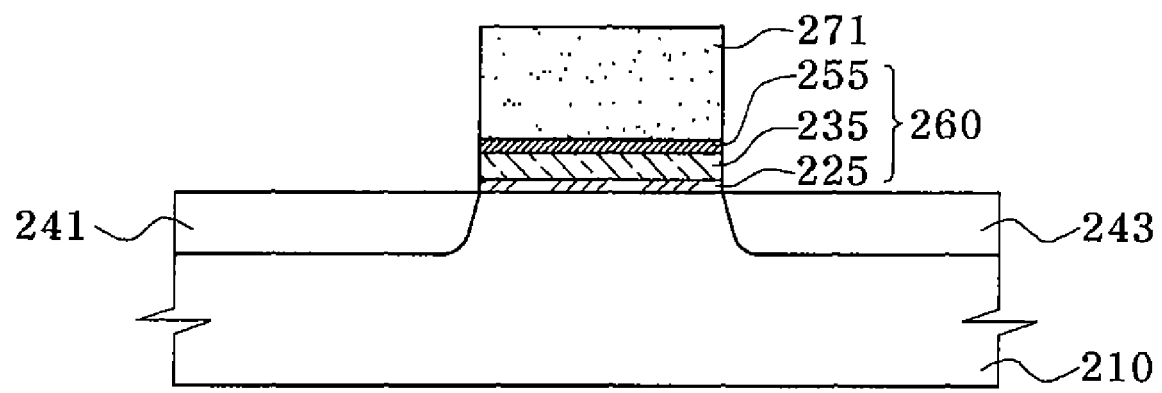

Referring to FIG. 16, a layer for a gate of a non-volatile memory transistor is formed on the blocking layer 255. The gate layer 271 is patterned using photolithographic and etch processes. As a result, a gate 271 and a charge trapping stack 260 are formed on the semiconductor substrate 210. A source region 241 and a drain region 243 are formed on the exposed region of the semiconductor substrate 110 to realize a memory cell transistor structure of a non-volatile memory device.

As is apparent from the foregoing, according to the present invention, the non-volatile memory device and the method for fabricating the device prevent formation of a silicon oxidation layer on the surface of a silicon substrate via introduction of a charge trapping structure having a stack consisting of three high-dielectric layers. The layers are formed with different compositions, thereby readily realizing improved electrical properties. The layers are stacked in accordance with a variation in deposition temperature and composition ratio to provide the high-dielectric layers with different dielectric constants. As a result, a difference in an energy band gap occurs between the layers. Accordingly, a charge trap is created via formation of an energy well structure. A tunneling layer, a charge trapping layer, and a blocking layer constituting a charge trapping stack can be formed through a consecutive process in a single piece of equipment. Therefore, high fabrication efficiency, low fabrication costs and high fabrication equipment efficiency can be realized.

In addition, the method of the present invention covers a wide control range of the composition ratio of the film via introduction of plasma treatment after deposition of the high-dielectric layer. The plasma treatment realizes composition control and stabilization at a low temperature, as compared to high-temperature thermal processing, thereby securing a high process margin. In other words, after adsorption of a main reactant, the composition of the film can be controlled via variation in plasma source and substrate temperature. In addition, the high-dielectric layers can be crystallized at a decreased temperature owing to activated plasma, thereby preventing crack defects caused by the difference in thermal expansion coefficients on an interface between the stacked layers resulting from rapid crystallization involved in subsequent high-temperature thermal processing. As a result, factors causing leakage current can be removed.

In addition, formation of an undesired oxidation layer on a semiconductor substrate can be avoided via introduction of an amorphous hafnium silicate layer into a charge trapping structure. Carriers created from a gate of a memory transistor device are present in a tunneling layer having a thickness of several nanometers (nm). Accordingly, it is preferable that the tunneling layer exhibits superior electrical properties via minimization of defects and roughness on an interface thereof. According to embodiments of the present invention, for realization of a high-quality interface, an amorphous hafnium silicate layer is used to prevent interface defects. By the addition of nitrogen to the amorphous hafnium silicate layer using a separate plasma treatment, the dielectric constant of the layer can be controlled in accordance with a variation in composition without forming a novel phase.

A low oxygen partial pressure and a deposition temperature can be utilized in the formation of compounds using a plasma treatment, thereby enabling improvement in dielectric breakdown characteristics. Furthermore, amorphous hafnium silicate eliminates dielectric polarization in accordance with a specific direction of grains, thereby avoiding carrier scattering which results from the dielectric polarization. As a result, operation characteristics of a non-volatile memory device can be more stably realized.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a non-volatile memory device, the method comprising:

adsorbing a silicon source on a surface of a semiconductor substrate;

supplying a hafnium source onto a layer of the absorbed silicon source to form an amorphous hafnium silicide ($HfSi_x$) layer;

supplying an oxidation source on the hafnium silicide layer to oxidize the hafnium silicide layer to form a hafnium silicate ($HfSi_xO_y$) of a tunneling layer;

forming a charge trapping layer over the tunneling layer;

forming a blocking layer over the charge trapping layer; and forming a gate electrode over the blocking layer.

2. The method according to claim 1, wherein the silicon source includes a silane gas or a silanol gas.

3. The method according to claim 1, wherein the oxidation source is supplied as a plasma which is excited from an oxygen-containing gas selected from the group consisting of: oxygen ($O_2$) and water vapor ($H_2O$).

4. The method according to claim 1, wherein the charge trapping layer comprises a hafnium oxide nitride ($HfO_xN_y$) layer or a hafnium silicate layer ($HfSi_xO_y$), each having a dielectric constant higher than that of the tunneling layer.

5. The method according to claim 1, wherein the tunneling layer is formed over the semiconductor substrate such that the tunneling layer is composed of a first hafnium silicate ($HfSi_{x1}O_{y1}$) layer, and the charge trapping layer is formed over the tunneling layer such that the charge trapping layer is composed of a second hafnium silicate ($HfSi_{x2}O_{y2}$) layer, wherein the dielectric constant of the second hafnium silicate ($HfSi_{x2}O_{y2}$) layer is higher than that of the first hafnium silicate ($HfSi_{x1}O_{y1}$) layer.

6. The method according to claim 4, wherein the hafnium oxide nitride ($HfO_xN_y$) layer is formed by adsorbing a hafnium source onto the tunneling layer and supplying an oxidation-nitration source on a layer of the adsorbed hafnium source.

7. The method according to claim 4, wherein the formation of the hafnium oxide nitride ($HfO_xN_y$) layer is carried out by inducing adsorption of hafnium oxide nitride on the tunneling layer via introduction of a hafnium source and an oxidation-nitration source.

8. The method according to claim 4, wherein forming the blocking layer comprises:

adsorbing a hafnium source on the hafnium oxide nitride layer; and subjecting the adsorbed hafnium source to oxidation via introduction of an oxidation source to form a hafnium oxide layer, wherein the blocking layer comprises one of the group consisting of: of zirconium oxide ($ZrO_2$), titanium oxide ($TiO_2$), tantalum oxide ($Ta_2O_5$), aluminum oxide ($Al_2O_3$), cesium oxide ($CeO_2$), lanthanum oxide ($La_2O_3$), tungsten oxide ($WO_3$) and yttrium oxide ($Y_2O_3$).

9. The method according to claim 6, further comprising:

subjecting the tunneling layer to a nitration surface treatment via introduction of a nitrogen plasma source on a surface of the tunneling layer, prior to adsorption of the hafnium source.

10. The method according to claim 6, wherein the oxidation-nitration source includes a mixed gas of oxygen and nitrogen, nitrous oxide ($N_2O$), or a mixed gas of ammonia ($NH_3$) and nitrous oxide ($N_2O$).

11. The method according to claim 6, wherein the oxidation-nitration source is introduced in a plasma-excited state.

12. The method according to claim 6, wherein the adsorption of the hafnium source and the introduction of the oxidation-nitration source are repeated to increase the thickness of the hafnium oxide nitride ($HfO_xN_y$) layer to a target level.

13. The method according to claim 6, wherein the hafnium oxide nitride ($HfO_xN_y$) layer is subject to a subsequent plasma treatment by introducing a gas selected from the group consisting of: oxygen ($O_2$), ozone ($O_3$), nitrogen ($N_2$), ammonia ($NH_3$), hydrazine ($N_2H_2$) and a combination thereof, in a plasma state.

14. The method according to claim 8, further comprising repeating the adsorption of the hafnium source and the introduction of the oxidation source.

15. The method according to claim 14, wherein after repeating the adsorption of the hafnium source and the introduction of the oxidation source, the hafnium oxide layer is subject to an oxygen plasma surface treatment to control the composition ratio of the hafnium oxide layer.

16. The method according to claim 5, wherein the hafnium silicate layer is formed by adsorbing a silicon source on a surface of the silicon substrate, introducing a hafnium source onto the adsorbed silicon source to form a hafnium silicide layer, and subjecting the hafnium silicide layer to oxidation via introduction of an oxidation source in a plasma state, wherein an introduction time of the silicon and oxidation sources, and a chamber pressure are controlled such that the first hafnium silicate ($HfSi_{x1}O_{y1}$) has a composition range of $x_1 > Y_1$, and the second hafnium silicate ($HfSi_{x2}O_{y2}$) has a composition range of $x_2 < Y_2$.

17. A method for fabricating a non-volatile memory device, the method comprising:

adsorbing a silicon source on a surface of the semiconductor substrate;

supplying a hafnium source onto a layer of the adsorbed silicon source to form an amorphous hafnium silicide ($HfSi_x$) layer;

supplying an oxidation-nitration source containing oxygen and nitrogen or containing oxygen and nitrogen in a plasma onto to the hafnium silicide ($HfSi_x$) layer to oxidize and nitrate the hafnium silicide ($HfSi_x$) layer to form a metal nitrogen-containing hafnium silicate ($HfSi_xO_yN_z$) of a tunneling layer;

forming a charge trapping layer over the tunneling layer;

forming a blocking layer over the charge trapping layer; and forming a gate electrode over the blocking layer.

18. The method according to claim 17, wherein the oxidation-nitration source includes one selected from the group consisting of: a nitric oxide (NO) gas and nitrous oxide ($N_2O$) gas.

19. A method for fabricating a non-volatile memory device, the method comprising:

forming a tunneling layer comprising a metal silicate layer over a semiconductor substrate;

forming a charge trapping layer comprising a hafnium oxide nitride ($HFO_xN_y$) layer or a hafnium silicate ($HfSi_xO_y$) layer, each having a dielectric constant higher than that of the metal silicate layer, over the tunneling layer;

adsorbing a hafnium source on the charge tunneling layer;

subjecting the absorbed hafnium source to oxidation via introduction of an oxidation source to form a hafnium oxide layer as a blocking layer; and forming a gate electrode over the blocking layer.

* * * * *